(12) United States Patent
Matsushita et al.

(10) Patent No.: US 7,616,171 B2
(45) Date of Patent: Nov. 10, 2009

(54) CONNECTING PART OF CONDUCTOR PATTERN AND CONDUCTOR PATTERNS-CONNECTED STRUCTURE

(75) Inventors: Taiga Matsushita, Tokyo (JP); Katumi Katakura, Tokyo (JP); Katsuyoshi Matsuura, Tokyo (JP)

(73) Assignee: Lintec Corporation, Tokyo (JP)

( * ) Notice: Subject to any disclaimer, the term of this patent is extended or adjusted under 35 U.S.C. 154(b) by 34 days.

(21) Appl. No.: 11/857,660

(22) Filed: Sep. 19, 2007

(65) Prior Publication Data
US 2008/0068272 A1 Mar. 20, 2008

(30) Foreign Application Priority Data
Sep. 20, 2006 (JP) .............................. 2006-255069

(51) Int. Cl.
*H01Q 1/36* (2006.01)
(52) U.S. Cl. ................. 343/895; 343/700 MS
(58) Field of Classification Search .......... 343/700 MS, 343/895, 741, 742, 906
See application file for complete search history.

(56) References Cited

U.S. PATENT DOCUMENTS

| 6,243,946 | B1* | 6/2001 | Suzuki et al. ................. 29/846 |
| 6,353,420 | B1* | 3/2002 | Chung ........................ 343/895 |
| 6,421,013 | B1* | 7/2002 | Chung ................. 343/700 MS |
| 6,933,892 | B2* | 8/2005 | Oberle ................ 343/700 MS |
| 2003/0011523 | A1* | 1/2003 | Oberle ................ 343/700 MS |
| 2005/0078035 | A1* | 4/2005 | Oberle ................ 343/700 MS |

FOREIGN PATENT DOCUMENTS

JP 2005-072458 3/2005

* cited by examiner

*Primary Examiner*—HoangAnh T Le
(74) *Attorney, Agent, or Firm*—Norris, McLaughlin & Marcus

(57) ABSTRACT

The present invention discloses a connecting part of conductor pattern, which is connected to a conductor pattern formed on a surface of an insulating substrate and which has at least one dent on the surface, and a conductor patterns-connected structure obtained by electrically connecting the connecting parts of conductor patterns, mentioned above, to each other with a conductive material which fills the inside of the dent of each connecting part and further is adhered to each connecting part.

4 Claims, 5 Drawing Sheets

CONNECTING PART OF CONDUCTOR PATTERN AND CONDUCTOR PATTERNS-CONNECTED STRUCTURE

TECHNICAL FIELD

The present invention relates to a connecting part of conductor pattern, formed so as to connect to a conductor pattern (e.g. an electronic circuit) formed on a surface of an insulating substrate.

The present invention relates further to a conductor patterns-connected structure obtained by connecting the above-mentioned connecting parts of conductor patterns, to each other using a conductive material.

BACKGROUND ART

In recent years, there have been widely used non-contact IC tag which is fitted to to-be-controlled persons or goods (adherends) for control of distribution, etc. of such persons or goods. This IC tag can store data in the IC chip built therein. Further, since the IC tag can communicate in non-contact with an interrogator, the stored data for control in the IC chip can be exchanged with the interrogator.

As the application fields of IC tag, there are various fields, for example, communication tickets for transport, control of incoming or outgoing of persons in business firms, etc., personal certification, inventory control of goods, logistics, etc. IC tags of various forms are being used so as to match respective application fields.

IC tag is fitted to, for example, a commodity and is placed in stores together with the commodity. When the commodity has been sold, the data stored in the IC chip of IC tag is read by an interrogator. With the read data, the physical distribution of the commodity is controlled.

In order to conduct the above-mentioned various controls accurately using an IC tag, the reliability of the circuit board constituting the IC tag is very important.

The circuit board of IC tag comprises an insulating substrate (e.g. a synthetic resin film) and various conductor patterns (e.g. electronic circuits) formed thereon. These conductor patterns are electrically connected to each other by using a conductive material to form a jumper(s), in some cases. In such cases, each jumper is formed on the upper part of the other conductor patterns. Therefore, in order to prevent the electrical conduction between the jumper and the other conductor patterns, an insulating layer is beforehand formed between them.

The jumper is formed on a complex structure consisting of an insulating substrate, conductor patterns, an insulating layer, etc. Therefore, there is a case that the conduction of the jumper is deteriorated with the passage of time.

There is described, in Patent Literature 1, a circuit board having a structure enabling the measurement of the conduction of jumper, in order to confirm the quality of produced circuit board. In this circuit board, there is provided, in the insulating layer covering the upper side of each conductor pattern, an opening which reaches the conductor pattern, and the conduction of jumper can be measured utilizing the opening. However, this circuit board is not constituted in order to allow the jumper to have stable conduction. The circuit board is constituted so that the quality of produced circuit board can be confirmed.

Patent Literature 1: JP-2005-72458A ([0053])

DISCLOSURE OF THE INVENTION

The present inventors made a study in order to solve the above-mentioned problems. In the course of the study, the present inventors thought that the deterioration of conduction of jumper is caused by the complex structure of the circuit board portion in which the jumper is formed. Ordinarily, the structure of the portion in which the jumper is formed, comprises an insulating substrate, conductor patterns formed thereon, an insulating layer formed thereon and a jumper formed thereon, and these components have their own thermal expansion coefficients. Therefore, they show respective different expansions and contractions with the change in environmental temperature. The present inventors thought that the different expansions and contractions bring about the deteriorated connection of jumper, inviting an increase in circuit resistance of jumper or, in an extreme case, disconnection of jumper.

The present inventors made a further study based on the above thought and, as a result, thought of an idea of making a dent(s) on the surface of the connecting part of a conductor pattern to be formed on the surface of an insulating substrate. By making a dent(s) on the surface of the connecting part, filling, in the dent(s), a conductive material (e.g. a conductive paste) and, in this state, connecting one end of a jumper to the connecting part, stable connection is secured between the connecting part and the jumper. As a result, there can be prevented the increase in the connection resistance between the connecting part and the jumper end, caused by the change in environmental temperature. The present inventors learned that the dent(s) of the connecting part can be made simultaneously with the formation of conductor pattern and no additional step is required for making the dent(s) and further that the above connection method using a connecting part having a dent(s) can be utilized not only in formation of jumper but also widely in ordinary connection between conductor pattern and conductive material. These knowledge has led to the completion of the present invention.

The present invention aims at providing a connecting part of conductor pattern which is stable to the change in environmental temperature and which can prevent the generation of inferior connection of a jumper which connects the connecting parts of different conductor patterns, and a conductor patterns-connected structure using such a connecting part.

The present invention is as follows.

1. A connecting part of conductor pattern, which is connected to a conductor pattern formed on the surface of an insulating substrate and which has at least one dent on the surface.
2. A connecting part of conductor pattern according to the above 1, wherein the dent has an opening area of 0.03 mm$^2$ or more.
3. A conductor patterns-connected structure obtained by electrically connecting the connecting parts of conductor patterns, set forth in the above 1 or 2, to each other with a conductive material which fills the inside of the dent of each connecting part and further is adhered to each connecting part.
4. An antenna circuit having an insulating substrate and a surface circuit formed thereon, wherein the surface circuit comprising a plane coil circuit and at least one pair of opposed electrodes connected to the plane coil circuit, and the antenna circuit is having a connected structure set forth in the above 3.

5. An IC inlet having an antenna circuit set forth in the above 4 and an IC chip.

6. An IC tag having an IC inlet set forth in the above 5.

According to the present invention, since the connecting part of conductor pattern has a dent(s) on the surface, filling of a conductive material in the dent(s) ensures reliable connection of the conductive material to the connecting part and there can be prevented the inferior connection of jumper, caused by the change in environmental temperature. As a result, the conductor patterns having the connected structure of the present invention have good long-term reliability. Further, since the dent(s) of the connecting part can be made in the step for forming a conductor pattern, no additional step is needed for making the dent(s).

BRIEF DESCRIPTION OF THE DRAWINGS

FIG. 7 is a plan view showing an IC inlet in which the connecting part of conductor pattern, of the present invention has been built in.

EXPLANATION OF NUMERALS 2 is an insulating substrate; 2A is one side of insulating substrate; 4 is an outer connecting part; 6 is a plane coil circuit; 8 is an inner connecting part; 10 is an insulating layer; 12 and 84 are each a jumper; 14 is a lead; 16 is one opposed electrode; 18 is other opposed electrode; 22 is an IC chip; 24, 26, 86a and 86b are each a dent; 28 is a conductive material; d is a depth; D is a thickness of connecting part; 52 is an adhesive layer; 54 is a release material; 80a and 80b are each a connecting part; 82a and 82b are each a conductor pattern; 92 and 94 are each a face stock; 100 is an antenna circuit; 110 is an IC inlet; 130, 200 and 210 are each an IC tag; and 204 is a resin layer.

BEST MODE FOR CARRYING OUT THE INVENTION

Figure 11:
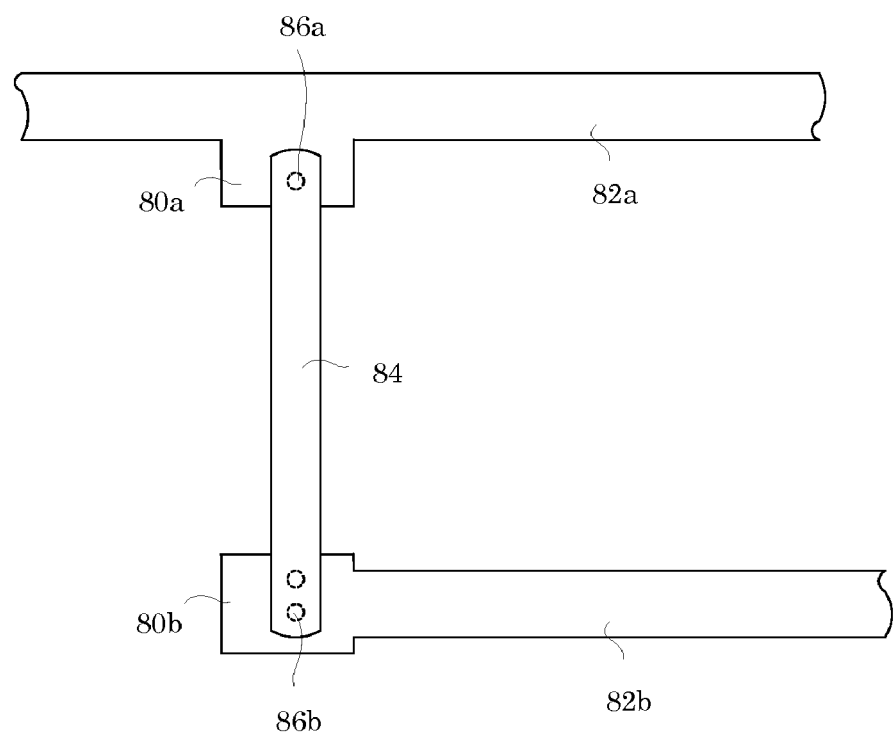
FIG. 11 is a conceptual view showing an example of the conductor patterns-connected structure of the present invention.

The connecting part of the present invention is a terminal connected to a conductor pattern. As shown in FIG. 11, the connecting parts 80a and 80b are used for electrically connecting, by use of a jumper 84, the given parts of independent conductor patterns 82a and 82b (each constituting an electronic circuit or the like) formed on an insulating substrate, to each other. Incidentally, 86a and 86b are each a dent which is described later.

The connecting part may be formed integrally with the conductor pattern. Or, the connecting part may be formed independently and then be connected to a conductor pattern formed separately, using, for example, a conductive material.

Description is made below on embodiments of the connecting part of conductor pattern and the conductor patterns-connected structure, both of the present invention. As an example of the conductor pattern, there is used an antenna circuit of IC tag.

Figure 1:
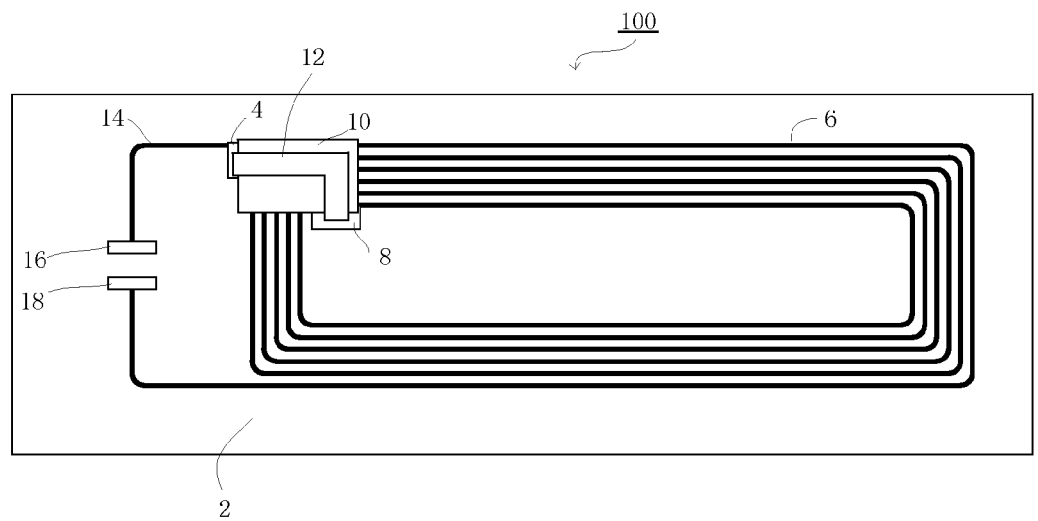
FIG. 1 is a plan view showing a constitution of the antenna circuit of the present invention.

FIG. 1 is a plan view showing an antenna circuit for IC tag.

In FIG. 1, 100 is an antenna circuit, and 2 is an insulating substrate. The insulating substrate 2 functions as a substrate for supporting a plane coil circuit, an IC chip, etc., all described later.

As the insulating substrate 2, there are preferred a paper (e.g. a wood-free paper or a coated paper), a synthetic resin film, etc. As to the resin material constituting the synthetic resin film, there is no particular restriction; and there are mentioned, for example, polyethylene, polypropylene, polyvinyl chloride, polystyrene, polyvinyl acetate, polybutene, polyacrylic acid ester, polymethacrylic acid ester, polyacrylonitrile, polyimide, polycarbonate, polyamide, ethylene-vinyl acetate copolymer, polyvinyl acetal, polyethylene terephthalate, and acrylonitrile-butadiene-styrene copolymer.

The thickness of the insulating substrate 2 is preferably 10 to 200 µm, particularly preferably 25 to 125 µm.

An outer connecting part 4 is formed near one corner of the insulating substrate 2. 6 is a plane coil circuit and is formed in a rectangular spiral shape on one side of the insulating substrate 2. The outer connecting part 4 and the plane coil circuit 6 are formed apart. The inner end of the plane coil circuit 6 is connected to an inner connecting part 8.

In the vicinity of the outer connecting part 4 is formed an insulating layer 10 so as to cover the upper side of the plane coil circuit 6. The inner connecting part 8 connected to the inner end of the plane coil circuit 6 is electrically connected to the outer connecting part 4 via a jumper 12 formed on the upper side of the insulating layer 10. However, the jumper 12 is insulated from the plane coil circuit 6 by the insulating layer 10.

Figure 2:
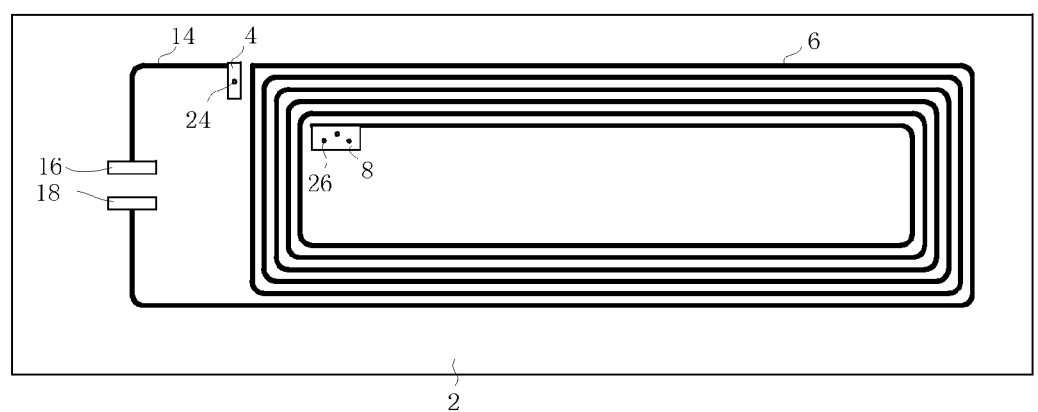
FIG. 2 is a view showing a step for producing the antenna circuit of FIG. 1.

In FIG. 2 is shown the constitution of a circuit pattern of FIG. 1 before formation of the insulating layer 10 and the jumper 12.

The outer connecting part 4 and one opposed electrode 16 are connected to each other by a lead 14.

The other opposed electrode 18 is formed apart by a given distance from the opposed electrode 16.

The outer end of the plane coil circuit 6 is connected to the other opposed electrode 18. 24 and 26 are dents formed respectively in the outer connecting part 4 and the inner connecting part 8. These dents are described in detail below with reference to FIG. 3.

Figure 3:
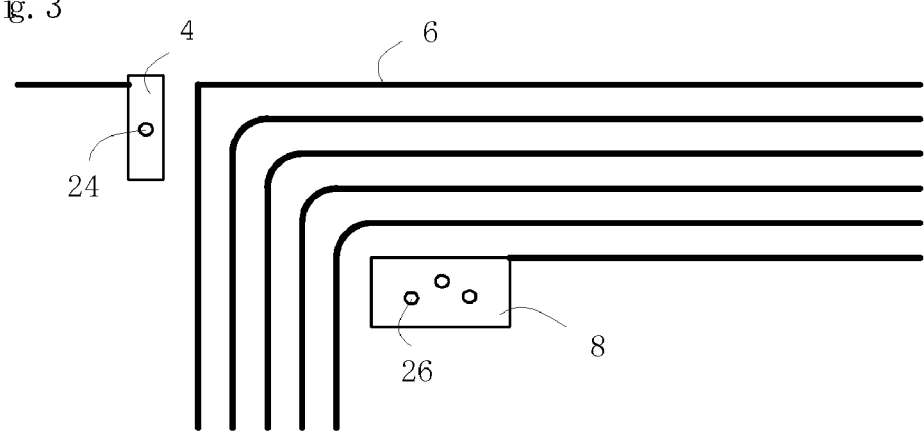
FIG. 3 is a partially enlarged plan view of FIG. 2.

FIG. 3 is an enlarged view of the outer connecting part 4, the inner connecting part 8 and their vicinities, shown in FIG. 2.

Figure 4:
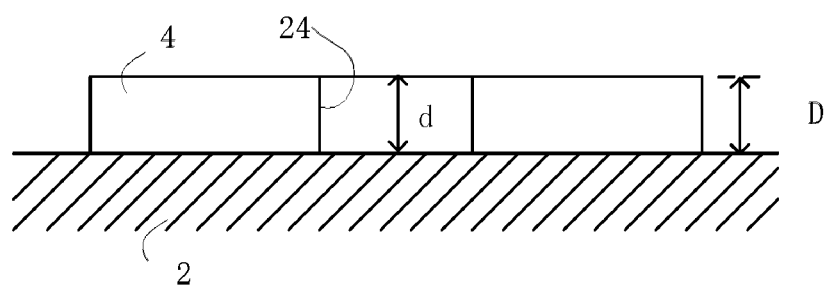
FIG. 4 is a view showing a structure of the dent of the present invention.
Figure 5:
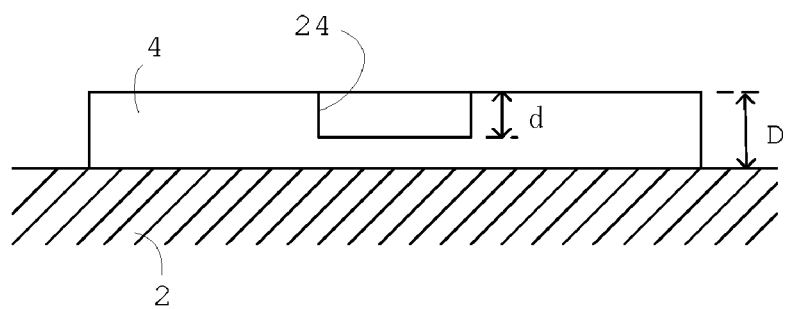
FIG. 5 is a view showing other structure of the dent of the present invention.

In the outer connecting part 4 formed on the insulating substrate 2 are formed a given number (one in this case) of dents 24 extending from the surface of outer connecting part 4 toward the insulating substrate 2. The depth d of this dent 24 may be equal to the thickness D of the outer connecting part 4 (that is, the dent 24 reaches the bottom of the outer connecting part 4), as shown in FIG. 4. Or, as shown in FIG. 5, the depth d may be smaller than the thickness D of the outer connecting part 4. As described later, when the jumper is formed by screen printing, the depth d of the dent 24 is preferably 100 μm or less, more preferably 10 to 50 μm, because a conductive material need be filled in the dent.

As to the opening area of the dent 24, there is no particular restriction. However, the opening area of the dent 24 is preferably 0.03 mm² or more, more preferably 0.1 to 5 mm², in order to ensure the adhesion between the jumper and the outer connecting part 4.

One dent 24 is formed in the outer connecting part 4. However, the number of the dent 24 may be any number. Ordinarily, the number of the dent 24 formed is preferred to be within 10 in view of the opening area of the dent 24 and the area of the outer connecting part 4.

As in the case of the outer connecting part 4, a given number (three in FIG. 2 and FIG. 3) of dents 26 of the same constitution as of the dent 24 are formed also in the inner connecting part 8. Since the constitution of the dents 26 are the same as of the dent 24, explanation thereof is not made.

Incidentally, the dents 24 and 26 are formed so as to have a circular opening shape. However, the opening shape is not restricted thereto and may be various, such as oval, triangular, tetragonal, any polygonal, indefinite and the like. Further, the opening areas in the depth direction of dent need not be the same. For example, the opening areas may become gradually smaller toward the depth direction from the opening end.

The jumper 12 electrically connecting the outer connecting part 4 and the inner connecting part 8 is formed using a conductive material. The conductive material is filled inside the dents 24 and 26 and further is adhered to the outer connecting part 4 and the inner connecting part 8 so as to cover their surfaces, and is cured. In this way, the jumper 12 is formed. Incidentally, the outer connecting part 4 and the inner connecting part 8 may be covered with the conductive material at the whole surfaces but may be covered partially.

Figure 6:
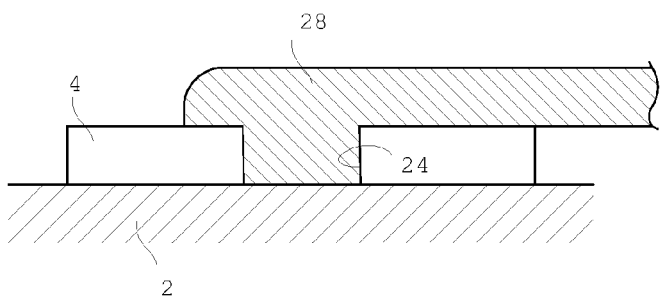
FIG. 6 is a view showing an example of the jumper structure at the dent of the present invention.

FIG. 6 shows a state in which a conductive material 28 for jumper formation has been coated on the upper side of the outer connecting part 4. The conductive material 28 is coated on the outer connecting part 4 in a state in which it has been filled inside the dent 24 formed in the outer connecting part 4.

The conductive material 28 is coated also on the inner connecting part 8 in a state in which it has been filled inside the dent 26 formed in the inner connecting part 8.

Then, the conductive material is cured, whereby a jumper 12 shown in FIG. 1 is formed. Thereby is formed an example of the conductor patterns-connected structure, of the present invention, comprising an outer connecting part 4, an inner connecting part 8, and a jumper 12 (conductive material) connecting the outer connecting part 4 and the inner connecting part 8.

In the present invention, the connecting parts 4 and 8, the plane coil circuit 6, the one opposed electrode 16, the other opposed electrode 18, the insulating layer 10, the jumper 12 and the lead 14 constitute an electronic circuit, and hereinafter they are generically referred as "surface circuit".

The plane coil circuit 6, the connecting parts 4 and 8, the one opposed electrode 16, the other opposed electrode 18, and the lead 14 are formed on one side of the insulating substrate 2 using a conductor metal (e.g. gold, silver, copper or aluminum) or a conductive paste (e.g. silver paste) or a conductive ink. In formation of the plane coil circuit, etc., there can be used any method ordinarily used for formation of electronic circuit. Specifically, there can be mentioned, for example, a method of screen printing using a conductive paste or a conductive ink or a method of forming a pattern of plane coil circuit, etc. on one side of an insulating substrate having a conductor metal laminated thereon, using a resist or the like, and then conducting etching to form a plane coil circuit, etc.

The formation of a plane coil circuit, etc. using a resist can be conducted specifically by a method of printing a resist pattern for formation of plane coil circuit, etc., on the copper foil side of a laminate film of copper foil and polyethylene terephthalate film, and then removing, by etching, the unnecessary copper foil portion on which no resist is printed, to form a plane coil circuit, etc. Preferably, the outer connecting part 4, the inner connecting part 8 and the dents 24 and 26 formed in these connecting parts are formed in the above etching step, simultaneously with formation of the plane coil circuit. In this case, no additional step is required and the dents 24 and 26 are formed simultaneously in the etching step.

Incidentally, the thickness of the conductor metal or the like forming the plane coil circuit, etc. is preferably 1 to 100 μm, particularly preferably 3 to 50 μm.

For the insulating layer 10, there can be used an insulating resin such as acrylic resin, urethane resin, acrylic urethane resin or the like. The insulating layer 10 can be formed so as to cover the upper portion of plane coil circuit 6 present between the outer connecting part 4 and the inner connecting part 8, by screen printing or the like. The thickness of the insulating layer 10 has no particular restriction and may be any as long as the plane coil circuit 6 and the upper side of the insulating layer 10 can be electrically insulated from each other. The thickness is preferably 1 to 100 μm, particularly preferably 3 to 50 μm.

The conductive material 28 constituting the jumper 12 can be prepared using a conductive paste (e.g. a silver paste) or a conductive ink. The jumper 12 can be formed on the upper side of the outer connecting part 4, the inner connecting part 8 and the insulating layer 10, using, for example, screen printing. As to the shape and thickness of the jumper 12, there is no particular restriction as long as the outer connecting part 4 and the inner connecting part 8 can be connected electrically. The shape of the jumper 12 may be, for example, a rectangular linear shape or, as shown in FIG. 1, a rectangular shape bent at right angles (i.e. L-shape). The thickness of the jumper 12 is preferably 1 to 100 μm, particularly preferably 3 to 50 μm.

(Antenna Circuit)

In the present invention, the insulating substrate 2 shown in FIG. 1 and a surface circuit formed on at least one side of the insulating substrate 2 are generically referred to as "antenna circuit 100". The antenna circuit 100 has no IC chip 22 mounted thereon. Mounting an IC chip on the antenna circuit 100 produces an IC inlet described later.

In the above, the antenna circuit has been explained on an antenna circuit having a pair of opposed electrodes, but the antenna circuit is not restricted thereto. For example, a large number of opposed electrodes are formed and they are connected to various parts of a plane coil circuit, whereby the inductance of coil may be selected as desired. Or, a jumper may be formed at the other side of an insulating substrate via the through-holes formed in the insulating substrate, or, a surface circuit may be formed on the both sides of an insulating substrate.

(IC Inlet)

Figure 7:
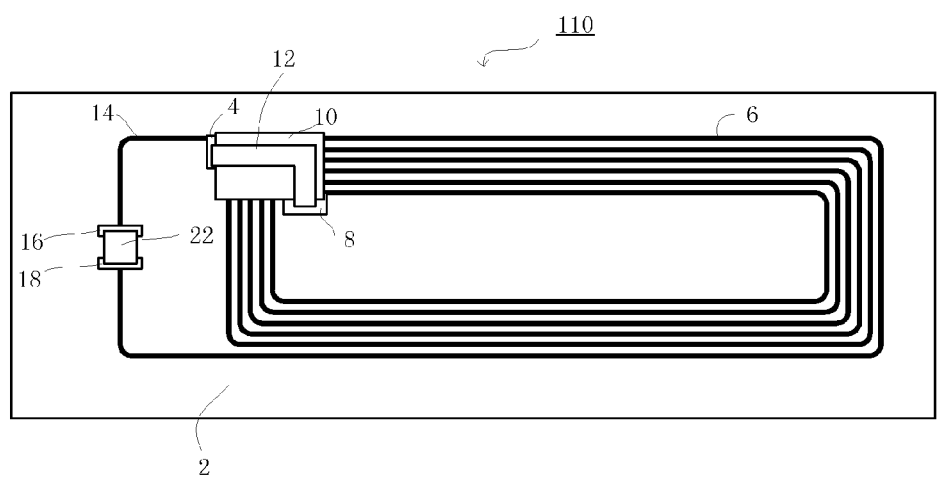

FIG. 7 is a plan view showing an example of the IC inlet 110 of the present invention. In the IC inlet 110, an IC chip 22 is mounted between the opposed electrodes 16 and 18 of the antenna circuit 100, shown in FIG. 1. The IC chip 22 and the opposed electrodes 16 and 18 are connected electrically.

The IC chip 22 is mounted by coating or attaching an adhesive material [e.g. an anisotropic conductive adhesive (ACP)] on the two opposed electrodes of surface circuit, and fitting an IC chip provided with a wire bump or a plating bump, to the two opposed electrodes of surface circuit. As the method for fixing the IC chip, thermocompression bonding is mentioned, for example.

The constitution of the antenna circuit 100 or the IC inlet 110 may be changed from the above explanations without departing from the spirit and scope of the present invention.

In the present invention, the IC inlet is processed further and the processed IC inlet is generically referred as "IC tag".

(First Type IC Tag)

Figure 8:
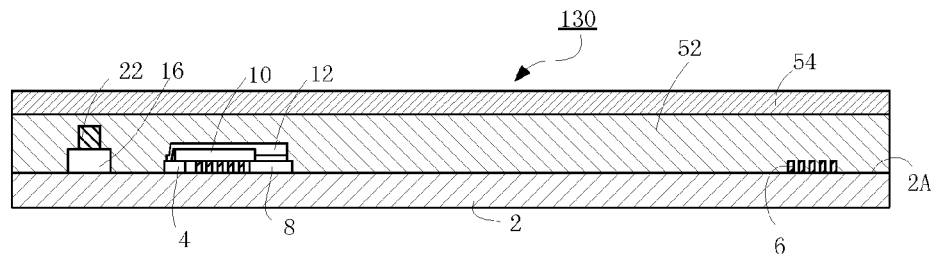
FIG. 8 is a sectional view showing an IC tag in which the connecting part of conductor pattern, of the present invention has been built.

FIG. 8 is a sectional side view of the first type IC tag of the present invention. In FIG. 8, 130 is an IC tag formed in a label shape. This IC tag is used by being attached to an adherend to be controlled. In the IC tag 130, an adhesive layer 52 is formed so as to cover the IC inlet 110 shown in FIG. 7, that is, the insulating substrate 2, the surface circuit formed on one side 2A of the insulating substrate 2, and the IC chip 22. To the upper side of the adhesive layer 52 is attached a release material 54 peelably.

In the present invention, adhesive means both of ordinary adhesive and ordinary pressure-sensitive adhesive.

The adhesive used in the adhesive layer 52 may be any known adhesive. As specific examples thereof, there can be mentioned an acrylic resin-based adhesive, a urethane resin-based adhesive, a natural rubber- or synthetic rubber-based adhesive, a silicone resin-based adhesive, a polyolefin-based adhesive, a polyester-based adhesive and an ethylene-vinyl acetate copolymer-based adhesive.

As the adhesive layer 52, there can be used one of double face adhesive tape type, wherein an intermediate material (not shown) is used as a core and an adhesive is coated on the both sides of the intermediate material. The intermediate material can be selected appropriately from the above-mentioned materials for the insulating substrate 2.

As the method for forming the adhesive layer 52, there can be mentioned, for example, a method of coating an adhesive on the side which has been subjected to a releasing treatment of a release material 54, and laminating the adhesive-coated side of the release material 54 with the side 2A of the insulating substrate 2, on which the surface circuit has been formed. The coating amount of the adhesive is preferably 5 to 100 g/m$^2$, particularly preferably 5 to 50 g/m$^2$.

As to the release material 54, there is no particular restriction. There is used, as the base material of the release material, a film made of a resin such as polyethylene terephthalate, polybutylene terephthalate, polyethylene, polyproylene, polyarylate or the like, or a paper such as polyethylene-laminated paper, polypropylene-laminated paper, clay-coated paper, resin-coated paper, glassine paper or the like; the base material is as necessary subjected to a releasing treatment, at the side to be adhered to the adhesive layer. In this case, the releasing treatment applied is, for example, formation of a release material layer made of a silicone-based resin, a long chain alkyl-based resin, a fluorine-based resin or the like, on one side of the base material. As to the thickness of the release material, there is no particular restriction, and the thickness may be selected appropriately.

As the method for coating the adhesive on the release material 54, there can be mentioned a method of coating an adhesive on a release material using, for example, an air knife coater, a blade coater, a bar coater, a gravure coater, a roll coater, a curtain coater, a die coater, a knife coater, a screen coater, a Meyer bar coater or a kiss coater, followed by drying.

Next, explanation is made on the method for using the IC tag, on a case of using the IC tag 130 shown in FIG. 8.

First, the release material 54 of IC tag 130 is peeled from the adhesive layer 52, and the resulting IC tag is attached to an adherend (not shown) (which is an object to be subjected to data control) via the adhesive layer 52. After the adherend of that state has passed through a commercial route or the like, the data stored in the IC chip 22 of IC tag 130 is referred and intended data control is conducted. Thereby, the data control role of the IC tag 130 is over.

(Second Type IC Tag)

The IC tag of the present invention can also have the following constitution.

The second type IC tag has a card shape. Unlike the first type, this type ordinarily has no adhesive layer at the surface for attachment.

Figure 9:
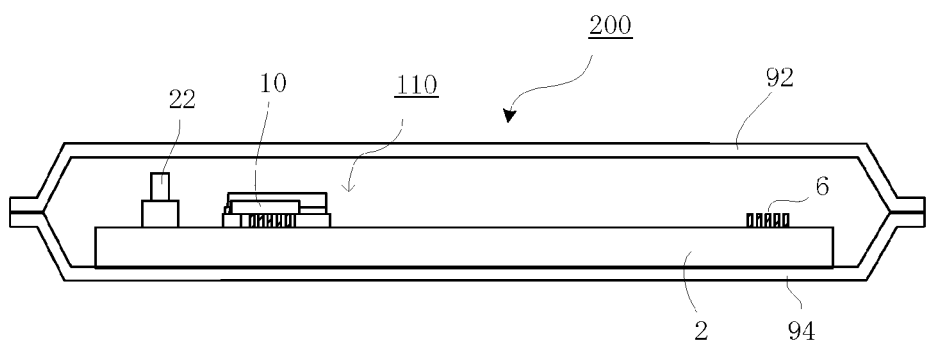
FIG. 9 is a sectional view showing other IC tag in which the connecting part of conductor pattern, of the present invention has been built.

FIG. 9 shows an example of the second type IC tag. In this IC tag, an IC inlet is accommodated in a surface-protecting layer formed in a bag shape, whereby an IC card shape is formed.

In the second type IC tag 200, an IC inlet 110 shown in FIG. 7 is sealed between two face stocks 92 and 94.

The shape, etc. of this type are the same as those of the first type; therefore, the same numerals are given for the same members, and explanation of individual numerals is not made.

Figure 10:
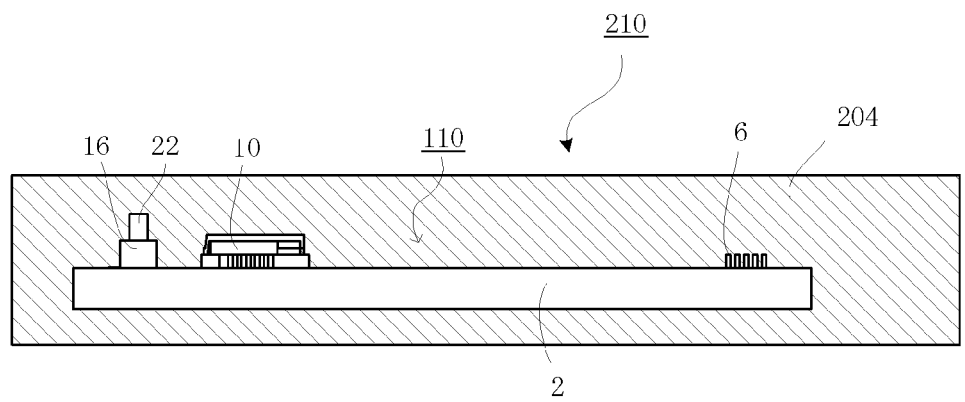
FIG. 10 is a sectional view showing still other IC tag in which the connecting part of conductor pattern, of the present invention has been built.

FIG. 10 shows other example of the second type IC tag. In this example, an IC tag 210 of card shape is formed using an IC inlet 110 shown in FIG. 7.

The both side of the IC inlet 110 is buried in a resin layer 204, whereby a card shape is formed. The resin layer 204 functions as a surface-protecting layer for inlet 110.

The resin layer 204 is preferred to be formed by injection molding. The conditions per se of injection molding are known. As the resin used for the resin layer 204, there are preferred polyethylene terephthalate, polycarbonate, polyacrylonitrile-butadiene, polyethylene, polypropylene, etc.

EXAMPLES

Example 1

(Production of Antenna Circuits)

Antenna circuits 100 shown in FIG. 1 were produced according to the following method.

First, a resist pattern for formation of an outer connecting part 4, a plane coil circuit 6, an inner connecting part 8, opposed electrodes 16 and 18 and a lead 14 was printed, by screen printing, on a copper foil-polyethylene terephthalate film (PET) laminate [NIKAFLEX (trade name), made by NIKKAN INDUSTRIES Co., Ltd. Cu/PET=35 μm/50 μm]. The resist pattern-printed laminate was subjected to etching to remove the unnecessary portion of copper foil, to produce an integrated wiring pattern shown in FIG. 2. Simultaneously with the etching, there were formed one dent 24 in the outer connecting part 4 and three dents 26 in the inner connecting part 8. Thereby was obtained a surface circuit having dents at the connecting part surfaces of the conductor patterns. The depths of dents 24 and 26 were each 35 μm; the opening area of each dent was 0.126 mm$^2$; and the line width of circuit was 0.2 mm.

Then, between the outer connecting part 4 and the inner connecting part 8 was formed an insulating layer 10 covering the plane coil circuit 6, by the use of an insulating resist ink (ML 25089 produced by ACHESON JAPAN LIMITED). Further, the outer connecting part 4 and the inner connecting part 8 were connected by a jumper 12. The jumper 12 was formed using a silver paste (DW 250 L-1 produced by Toyobo Co., Ltd.). Also, the silver paste was filled in the dents 24 and 26.

The formation of the insulating layer 10 and the jumper 12 was made by screen printing. Thus were produced 22 pieces of antenna circuits 100 each having a conductor patterns-connected structure wherein a conductive material was filled in the dents of connecting parts and thereby the connecting parts were electrically connected to each other.

Next, a DC resistance was measured between the outer connecting part 4 and the inner connecting part 8 to determine a resistance of jumper 12 for all 22 pieces of antenna circuits 100.

Then, the 22 pieces of antenna circuits 100 were subjected to a thermal shock test of 400 cycles. After the thermal shock test, a DC resistance was measured between the outer connecting part 4 and the inner connecting part 8 to determine a resistance of jumper 12 for all 22 pieces of antenna circuits 100. The results are shown in Table 1. The change in resistance of jumper 12 was in an error range for all the antenna circuits 100, and no substantial change in resistance was seen.

The thermal cycle of the thermal shock test was as follows. Holding times at −30° C. and at 85° C. were each 30 minutes; the interval was 10 minutes; and these constituted 1 cycle.

(Production of IC Inlets)

A RFID-IC chip (I Code produced by Philips Semiconductors) was mounted on each antenna circuit 100 produced above. In the mounting, there was used Flip Chip mounting Machine (FB 30T-M produced by Kyushu Matsushita Electric Co., Ltd.). The adhesive material used in the mounting was an anisotropic conductive adhesive (TAP 0402E produced by Kyocera Chemical Corporation). The IC chip was fitted to each antenna circuit by thermocompression bonding under the conditions of 220° C., 1.96 N (200 gf) and 7 seconds, to form each IC inlet.

(Production of IC Tags)

Then, an acrylic adhesive (PA-T1 produced by LINTEC CORPORATION) was coated, using a screen coater, on the releasing treatment side of a release material (LINTEC CORPORATION'S SP-8KX of 80 μm in thickness, produced by coating a silicone-based resin on a glassine paper) so that the coated amount after drying became 25 g/m², whereby a releasing sheet was prepared. The acrylic adhesive-coated side of the releasing sheet was laminated on the whole area of the circuit-formed side of the insulating substrate 2.

On the no circuit-formed side of the insulating substrate 2 was laminated, as an indication layer, a material obtained by coating in an thickness of 20 μm an acrylic adhesive (PA-T1 produced by LINTEC CORPORATION) on CRISPER K2411 (produced by Toyobo Co., Ltd., 50 μm in thickness), whereby 22 pieces of IC tags were produced.

Example 2

22 pieces of antenna circuits 100 were produced in the same manner as in Example 1 except that the opening areas of the dents of the two connecting parts 4 and 8 were each 0.5 mm². A thermal shock test was conducted in the same manner as in Example 1, to measure the change in resistance of jumper before and after the test. The change in resistance of jumper 12 was in an error range for all the antenna circuits 100, and no substantial change in resistance was seen. The results are shown in Table 1.

IC inlets and IC tags were produced in the same manners as in Example 1.

Comparative Example 1

22 pieces of antenna circuits were produced in the same manner as in Example 1 except that no dent was formed in the connecting part 4 or 8. A thermal shock test was conducted in the same manner as in Example 1, to measure the change in resistance of jumper before and after the test. An apparent increase was seen in the resistances of the jumpers 12 of 6 pieces (27%) of antenna circuits. No change was seen in the resistances of remaining 16 antenna circuits. The results are shown in Table 1. In Table 1, each resistance indicates an average.

TABLE 1

|  | Resistance before test (Ω) | Resistance after test (Ω) | Percent defective |
| --- | --- | --- | --- |
| Example 1 | 0.43 | 0.44 | 0 |
| Example 2 | 0.40 | 0.46 | 0 |
| Comparative Example 1 | 0.43 | 0.48 (16 circuits) 8.84 (6 circuits) | 27 |

The invention claimed is:

1. A conductor patterns-connected structure obtained by electrically connecting a first connecting part of a first conductor pattern to a second connecting part of a second conductor pattern, wherein the first connecting part of the first conductor pattern is connected to the first conductor pattern formed on a surface of an insulating substrate, wherein the first connecting part of the first conductor pattern has at least one dent on the surface of the insulating substrate, wherein the at least one dent is not passing through the insulating substrate, wherein the first connecting part of the first conductor pattern is connected to the second connecting part of the second conductor pattern with a conductive material which fills the inside of the dent of the first connecting part and further is adhered to each connecting part.

2. An antenna circuit having an insulating substrate and a surface circuit formed thereon, wherein the surface circuit comprising a plane coil circuit and at least one pair of opposed electrodes connected to the plane coil circuit, wherein the antenna circuit comprises a conductor patterns-connected structure obtained by electrically connecting a first connecting part of a first conductor pattern to a second connecting part of a second conductor pattern, wherein the first connecting part of the first conductor pattern is connected to the first conductor pattern formed on a surface of the insulating substrate, wherein the first connecting part of the first conductor pattern has at least one dent on the surface of the insulating substrate, wherein the at least one dent is not passing through the insulating substrate, wherein the first connecting part of the first conductor pattern is connected to the second connecting part of the second conductor pattern with a conductive material which fills the inside of the dent of the first connecting part and further is adhered to each connecting part.

3. An IC inlet comprising:
an antenna circuit having an insulating substrate and a surface circuit formed thereon, wherein the surface circuit comprising a plane coil circuit and at least one pair of opposed electrodes connected to the plane coil circuit, wherein the antenna circuit comprises a conductor patterns-connected structure obtained by electrically connecting a first connecting part of a first conductor pattern to a second connecting part of a second conductor pattern, wherein the first connecting part of the first conductor pattern is connected to the first conductor pattern formed on a surface of the insulating substrate, wherein the first connecting part of the first conductor pattern has at least one dent on the surface of the insulating substrate, wherein the at least one dent is not passing through the insulating substrate, wherein the first connecting part of the first conductor pattern is connected to the second connecting part of the second conductor pattern with a conductive material which fills the inside of the dent of the first connecting part and further is adhered to each connecting part; and an IC chip.

4. An IC tag comprising:

an IC inlet having an IC chip and an antenna circuit, wherein the antenna circuit has an insulating substrate and a surface circuit formed thereon, wherein the surface circuit comprising a plane coil circuit and at least one pair of opposed electrodes connected to the plane coil circuit, wherein the antenna circuit comprises a conductor patterns-connected structure obtained by electrically connecting a first connecting part of a first conductor pattern to a second connecting part of a second conductor pattern, wherein the first connecting part of the first conductor pattern is connected to the first conductor pattern formed on a surface of the insulating substrate, wherein the first connecting part of the first conductor pattern has at least one dent on the surface of the insulating substrate, wherein the at least one dent is not passing through the insulating substrate, wherein the first connecting part of the first conductor pattern is connected to the second connecting part of the second conductor pattern with a conductive material which fills the inside of the dent of the first connecting part and further is adhered to each connecting part.

* * * * *